United States Patent
Danzl

(10) Patent No.: US 7,211,494 B2
(45) Date of Patent: May 1, 2007

(54) SEMICONDUCTOR STRUCTURES UTILIZING THIN FILM RESISTORS AND TUNGSTEN PLUG CONNECTORS AND METHODS FOR MAKING THE SAME

(75) Inventor: Ralph B Danzl, Tempe, AZ (US)

(73) Assignee: Medtronic, Inc., Minneapolis, MN (US)

( * ) Notice: Subject to any disclaimer, the term of this patent is extended or adjusted under 35 U.S.C. 154(b) by 268 days.

(21) Appl. No.: 11/023,665

(22) Filed: Dec. 28, 2004

(65) Prior Publication Data

US 2006/0138596 A1    Jun. 29, 2006

(51) Int. Cl.
*H01L 21/20* (2006.01)
*H01L 29/00* (2006.01)

(52) U.S. Cl. .............. 438/382; 438/384; 257/536; 257/537; 257/542

(58) Field of Classification Search .......... 438/382, 438/384; 257/E21.004, E21.295, E21.575, 257/536, 537, 542
See application file for complete search history.

(56) References Cited

U.S. PATENT DOCUMENTS

| | | | |
|---|---|---|---|
| 6,524,925 B1 | 2/2003 | Lee | 438/384 |
| 6,645,821 B2 | 11/2003 | Bailey et al. | 438/382 |
| 6,734,076 B1 | 5/2004 | Jaiswal et al. | 438/384 |
| 6,737,326 B2 | 5/2004 | Steinmann et al. | 438/381 |
| 2004/0087098 A1* | 5/2004 | Ng et al. | 438/381 |

OTHER PUBLICATIONS

Danzl, R. et al., "Rapid Low-Cost Development of a Planarized 3-Level Interconnect Module," *Proceeding 9th International CMP-MIC*, Los Angeles, CA (Feb. 2004).

* cited by examiner

*Primary Examiner*—Hsien-Ming Lee
(74) *Attorney, Agent, or Firm*—Carol F. Barry; Girma Wolde-Michael

(57) ABSTRACT

Semiconductor structures and methods for fabricating semiconductor structures are provided. The method comprises forming a first insulating layer having a substantially planar surface overlying a first conductive layer of an interconnect stack. A thin film resistor is formed overlying the first insulating layer and a second insulating layer is deposited overlying the first insulating layer and the resistor. A portion of the second insulating layer is removed to form a substantially planar surface. The second insulating layer is anisotropically etched to form a first via to the first conductive layer and a fill material comprising tungsten is deposited within the first via. The second insulating layer is wet etched to form a second via to the thin film resistor and a second conductive layer is deposited overlying the second insulating layer and within the second via.

20 Claims, 5 Drawing Sheets

SEMICONDUCTOR STRUCTURES UTILIZING THIN FILM RESISTORS AND TUNGSTEN PLUG CONNECTORS AND METHODS FOR MAKING THE SAME

FIELD OF THE INVENTION

The present invention generally relates to semiconductor structures, and more particularly relates to semiconductor structures utilizing thin film resistors and tungsten plug connectors.

BACKGROUND OF THE INVENTION

Thin film resistors are desirable components for high precision analog and mixed signal applications, such as medical device applications. In addition to a low thermal coefficient of resistance, low voltage coefficient of resistance, and good resistor matching, they typically provide good stability under stress. Chromium-silicon (CrSi) resistors are particularly well suited for use in medical devices because the resistivity of CrSi resistors can be controlled within about 1 to 2% and resistor matching is easier than with other thin film resistors, such as nickel-chromium (NiCr) resistors. In addition, CrSi is a cleaner working material than other thin film resistor materials such as NiCr.

The manufacture of semiconductor devices with thin film resistors presents a number of challenges. One challenge related directly to the thin film resistors is location. Thin film resistors often are sandwiched between layers of metal or below and offset from one or more metal layers of the interconnect stack. At these locations, the thin film resistors are exposed to a number of thermal cycles during formation of the interconnect stacks and overlying devices. Each thermal cycle degrades the resistor values of the thin film resistors. Accordingly, the thin film resistors may have resistor values that are substantially different from the original, desired resistor values.

Other challenges are related to formation of the interconnect stacks themselves. For example, certain applications, such as medical equipment applications, are requiring semiconductor devices with smaller geometries. However, such small geometries are difficult to achieve by present-day fabrication techniques. Interconnect stacks typically utilize copper layers and copper interconnect lines that are formed using damascene or inlaid processes. During a damascene process, a dielectric layer is deposited overlying a previously fabricated metal layer or plug. A photoresist mask is deposited on the dielectric layer and a via contact is etched within the dielectric to the previously fabricated metal layer or plug. Copper then is deposited within the via contact. However, the etching of the via contacts to the various interconnect layers during such damascene processes is often imprecise because the photoresist masks used to form the vias often are deposited on uneven dielectric layer surfaces. Thus, space between the interconnect layers or other devices has to be maintained to compensate for any photolithography misalignment.

Another challenge encountered by typical copper interconnect technology involves the often inadequate step coverage achieved with a copper deposit within the vias. In a typical metal deposition process, voids within the via contacts may form. The voids tend to aggregate and create reliability issues for the interconnection.

Accordingly, it is desirable to provide a semiconductor structure that is formed with a thin film resistor that is not substantially degraded by thermal cycles. In addition, it is desirable to provide a semiconductor structure that is formed with a thin film resistor and that is suitable for reduction to small geometries. Moreover, it is desirable to provide a semiconductor structure with a thin film resistor with enhanced reliability. It also is desirable to provide methods for fabricating such semiconductor structures. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for fabricating a semiconductor structure having at thin film resistor is provided. The method comprises forming a first conductive layer of an interconnect stack. A dielectric material layer is deposited overlying the first conductive layer and a layer of spin-on-glass is deposited overlying the dielectric material layer. A portion of the layer of spin-on-glass is removed to form a first insulating layer having a first substantially planar surface. A thin film resistor is formed overlying the first insulating layer and a second insulating layer is deposited overlying the first insulating layer and the thin film resistor. A portion of the second insulating layer is removed to form a substantially planar surface of the second insulating layer. The second insulating layer is anisotropically etched to form a first via to the first conductive layer and a fill material comprising tungsten is deposited within the first via to form a conductive plug that is electrically coupled to the first conductive layer. The second insulating layer also is wet etched to form a second via to the thin film resistor and a second conductive layer is deposited overlying the second insulating layer and within the second via.

In accordance with another exemplary embodiment of the present invention, a semiconductor structure having a thin film resistor is provided. The semiconductor structure comprises a first conductive layer of an interconnect stack and a first insulating layer overlying the first conductive layer. The first insulating layer comprises a dielectric material and spin-on-glass and has a first substantially planar surface. A thin film resistor is disposed overlying the first insulating layer. A second insulating layer overlies the thin film resistor and the first substantially planar surface of the first insulating layer and has a second substantially planar surface. A second conductive layer overlies the second substantially planar surface of the second insulating layer. A conductive via is disposed between the second conductive layer and the thin film resistor and electrically couples the second conductive layer and the thin film resistor. A conductive plug comprising tungsten is disposed between the second conductive layer and the first conductive layer and electrically couples the second conductive layer and the first conductive layer.

In accordance with a further exemplary embodiment of the present invention, a method for fabricating a semiconductor structure having at thin film resistor is provided. The method comprises providing an interconnect stack disposed at least partially within at least one dielectric material. A first insulating layer is formed overlying the interconnect stack such that a surface of the first insulating layer is substantially planar. A second insulating layer is deposited overlying the first insulating layer and a thin film resistor is formed overlying the second insulating layer. A third insulating layer is deposited overlying the second insulating layer and the resistor. A portion of the third insulating layer is removed so that a surface of the third insulating layer is substantially planar. The third insulating layer is anisotropically etched to form a first via to the interconnect stack. A tungsten-comprising fill material is deposited within the first via and overlying the substantially planar surface of the third insulating layer and a portion of the fill material is removed to form a conductive plug electrically coupled to the interconnect stack. The third insulating layer then is wet etched to form a second via to the thin film resistor. A conductive layer is deposited overlying the third insulating layer, the conductive plug, and within the second via.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary and is not intended to limit the invention or the application and uses of the invention. Furthermore, there is no intention to be bound by any theory presented in the preceding background of the invention or the following detailed description of the invention.

Figure 1:
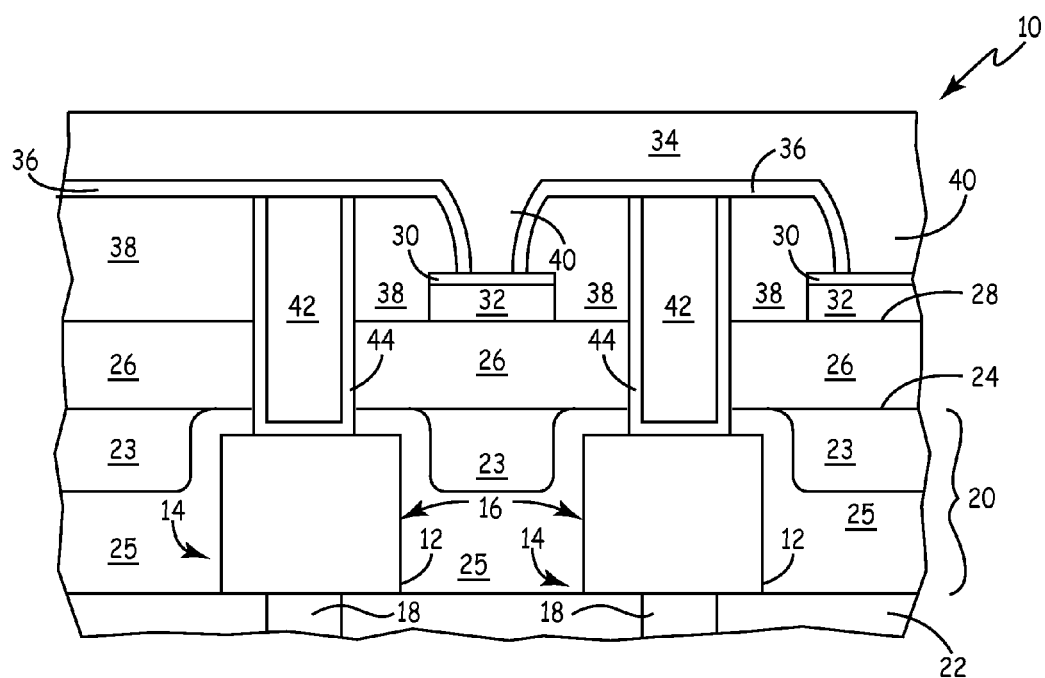
FIG. 1 is a cross-sectional view of a semiconductor structure with a thin film resistor in accordance with an exemplary embodiment of the present invention.

FIG. 1 is a cross-sectional view of a portion of a semiconductor structure 10 in accordance with an exemplary embodiment of the present invention. Semiconductor structure 10 comprises a first conductive layer 12 disposed at a first end 16 of an interconnect stack 14. As used herein, the term "layer" means one layer or a combination or plurality of layers or sub-layers. In addition to first conductive layer 12, interconnect stack 14 may comprise any suitable number of other conductive layers (not shown) that may be disposed within one or more dielectric material layers or sub-layers 22. The conductive layers of interconnect stack 14, including first conductive layer 12, are electrically coupled in a stack formation by one or more conductive vias 18 disposed between the conductive layers. Interconnect stack 14 is configured at a second end (not shown) to provide the interconnections to integrated circuitry (not shown) of semiconductor structure 10, such as, for example, input/output circuits, transistors, data/address decoders, comparators, power circuits, and any other suitable integrated circuits, that may be formed within or overlying a semiconductor substrate, such as, for example, a silicon substrate. First conductive layer 12 and the other conductive layers and vias of interconnect stack 14 may comprise any suitable conductive material, preferably a metal such as aluminum (Al), aluminum alloys, copper (Cu), copper alloys, and the like, as is well known in the semiconductor industry. First conductive layer 12 also may comprise a barrier layer disposed above and/or below the conductive material. The barrier layer may comprise any suitable barrier layer material, such as, for example, tantalum (Ta), tantalum nitride (TaN), titanium (Ti), titanium nitride (TiN), titanium tungsten (TiW), or the like.

Semiconductor structure 10 further comprises a first insulating layer 20 overlying first conductive layer 12. First insulating layer 20 may comprise a suitable dielectric material 25, such as, for example, tetraethyl orthosilicate (TEOS)-derived silicon dioxide, plasma-enhanced nitride (PEN), silicon nitride, silicon dioxide, and the like. Preferably, first insulating layer 20 comprises TEOS-derived silicon dioxide. As described in more detail below, first conductive layer 12 may be formed by a subtractive method or by a damascene or inlaid process, as is well known in the semiconductor industry. In one embodiment of the invention, as illustrated in FIG. 1, when first conductive layer 12 is formed by a subtractive method, first conductive layer 12 may be formed overlying sub-layer(s) 22 of dielectric material in which a portion of interconnect stack 14 is disposed. First insulating layer 20 then may be disposed about the side and top surfaces of first conductive layer 12. In an alternative embodiment of the invention, when first conductive layer 12 is formed by a damascene or inlaid process, first insulating layer 20 may be disposed substantially overlying an exposed top surface of first conductive layer 12 and the layer(s) of dielectric material within which first conductive layer 12 is formed. In one embodiment of the invention, the thickness of the dielectric material 25 of first insulating layer 20 overlying first conductive layer 12 is in the range of about 1000 to 5000 Angstroms. In a preferred embodiment of the invention, the thickness of the dielectric material 25 of first insulating layer 20 overlying first conductive layer 12 is in the range of about 2000 to 4000 Angstroms and, more preferably, is about 3000 Angstroms.

First insulating layer 20 also may comprise spin-on-glass 23 that is disposed within gaps, crevices, or other void spaces of the dielectric material. As described in more detail below, the deposition of spin-on-glass 23 overlying the dielectric material of first insulating layer 20 fills in the void spaces of the dielectric material, thus contributing to a substantially planar surface 24 of first insulating layer 20.

In one exemplary embodiment of the invention, semiconductor structure 10 further comprises a second insulating layer 26. Second insulating layer 26 may comprise any suitable dielectric material such as, for example, tetraethyl orthosilicate (TEOS)-derived silicon dioxide, plasma-enhanced nitride (PEN), silicon nitride, silicon dioxide, and the like. Preferably, second insulating layer 26 comprises TEOS-derived silicon dioxide. In one embodiment of the invention, the thickness of second insulating layer 26 is in the range of about 5,000 to about 25,000 Angstroms. In a preferred embodiment of the invention, the thickness of second insulating layer 26 is in the range of about 10,000 to about 20,000 Angstroms. Because second insulating layer 26 is disposed overlying the substantially planar surface 24 of first insulating layer 20, second insulating layer 26 also may have a substantially planar surface 28. However, second insulating layer 26 also may be subjected to a planarization process, such as chemical mechanical planarization (CMP), electrochemical mechanical planarization (ECMP), etching, sputtering, or the like, to facilitate a substantially planar surface 28.

Semiconductor structure 10 also comprises a thin film resistor 30. The thin film resistor 30 may comprise any suitable thin film resistor material, such as chromium silicon (CrSi), nickel chromium (NiCr), tantalum nitride (TaN), titanium nitride (TiN), or the like. Preferably, thin film resistor 30 comprises CrSi. In one embodiment of the invention, thin film resistor 30 has a thickness in the range of about 50 to about 1000 Angstroms. In a preferred embodiment of the invention, thin film resistor has a thickness in the range of about 100 to about 500 Angstroms.

In one exemplary embodiment of the invention, semiconductor structure 10 also may comprise a protective layer 32 underlying thin film resistor 30. Protective layer 32 serves to protect thin film resistor 30 from diffusion of hydrogen atoms and other species that may degrade the resistance values and, hence, the performance of thin film resistor 30. Protective layer 32 may comprise any suitable material, such as, for example, silicon nitride. In one embodiment of the invention, protective layer 32 has a thickness in the range of about 100 to about 1000 Angstroms.

While semiconductor structure 10 is illustrated in FIG. 1 with a first insulating layer 20, an overlying second insulating layer 26, and a thin film resistor disposed on second insulating layer 26, it will be appreciated that, in another exemplary embodiment of the invention, the dielectric material 25 of first insulating layer 20 could be sufficiently thick so that second insulating layer 26 may be eliminated. In this regard, in one embodiment of the invention, the dielectric material 25 of first insulating layer 20 may have a thickness in the range of about 10,000 to about 30,000 Angstroms.

Semiconductor structure 10 further may comprise a third insulating layer 38 overlying second insulating layer 26 and thin film resistor 30. Third insulating layer 38 may comprise any suitable dielectric material, such as those dielectric materials suitable to form first and second insulating layers 20 and 26. Preferably, third insulating layer 38 is formed of a dielectric material that comprises no significant amount of dopant that would adversely affect the resistor values of the thin film resistors 30. In one embodiment of the invention, the thickness of third insulating layer 38 may be in the range of about 1,000 to about 5,000 Angstroms. Preferably, the thickness of third insulating layer 38 may be in the range of about 2,000 to about 4,000 Angstroms and more preferably is about 3,000 Angstroms.

A second conductive layer 34 is disposed overlying third insulating layer 38 and is electrically coupled to a thin film resistor 30 by a via 40. Via 40, or vias 40 if there is more than one via, may be integral with second conductive layer 34 or may be formed separately from second conductive layer 34. Second conductive layer 34 and vias 40 may comprise any suitable conductive material, as is well known in the semiconductor industry. Preferably, second conductive layer 34 and vias 40 comprise a metal, such as aluminum (Al), aluminum alloys, copper (Cu), copper alloys, or the like.

In one exemplary embodiment of the invention, a barrier layer 36 may be disposed underlying second conductive layer 34 and within vias 40, as illustrated in FIG. 1. The barrier layer may serve to improve the adhesion of the second conductive layer 34 to third insulating layer 38 and to act as a barrier against diffusion of the material of second conductive layer 34. Barrier layer 36 may comprise tantalum (Ta), tantalum nitride (TaN), or any other suitable materials.

Second conductive layer 34 also is electrically coupled to first conductive layer 12 by a conductive plug 42, which extends between first conductive layer 12 and second conductive layer 34 through first, second and third insulating layers 20, 26, and 38. Conductive plug 42 comprises a tungsten (W)-comprising fill material. As described in more detail below, during formation of conductive plug 42, the tungsten-comprising fill material is deposited within a void space disposed through first, second and third insulating layers 20, 26, and 38 to first conductive layer 12. The tungsten-comprising fill material provides step coverage within the void space of no less than 50%. In this regard, the void space to the first conductive layer 12 may be fabricated with narrow dimensions so that real estate between conductive plugs 42 and thin film resistors 30 may be reduced and/or minimized. Accordingly, with this available real estate, more devices or circuitry may be provided in semiconductor structure 10 than would be permitted if conventional metal vias were used to electrically couple first conductive layer 12 and second conductive layer 34.

In one exemplary embodiment of the present invention, conductive plug 42 may also comprise a barrier layer 44. Barrier layer 44 may comprise any suitable material, such as those materials suitable for forming barrier layer 36. Barrier layer 44 serves as a barrier to diffusion of the tungsten-comprising fill material from conductive plug 42.

Figure 2:
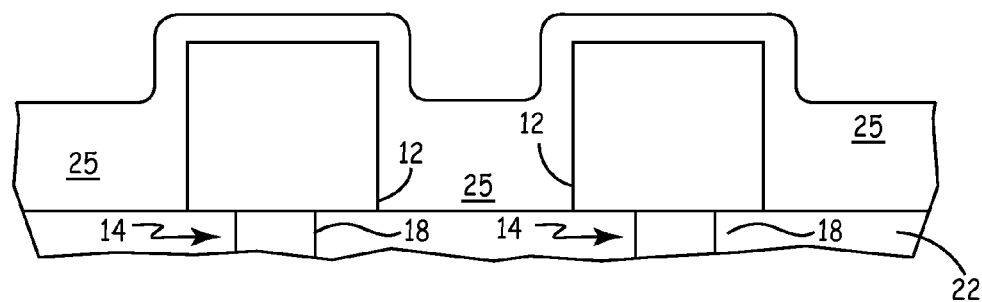
FIGS. 2–8 illustrate schematically, in cross section, a method for fabricating the semiconductor structure of FIG. 1 in accordance with an exemplary embodiment of the present invention.

FIGS. 2–8 illustrate a method for fabricating semiconductor structure 10 in accordance with an exemplary embodiment of the present invention. Referring to FIG. 2, an interconnect stack 14 is fabricated overlying a semiconductor substrate (not shown), such as, for example, a silicon substrate, and is electrically coupled to integrated circuitry (not shown) of semiconductor structure 10, such as, for example, input/output circuits, transistors, data/address decoders, comparators, power circuits, and any other suitable integrated circuits, that may be formed within or overlying the semiconductor substrate. The interconnect stack 14 may be fabricated with various conductive layers (not shown) that are electrically coupled in a stack formation by conductive vias 18 disposed between the conductive layers. The conductive layers (not shown) and vias 18 of interconnect stack 14 may be formed in one or more dielectric material sublayers 22.

An overlying conductive layer, that is, first conductive layer 12, then may be fabricated in electrical communication with interconnect stack 14. It will be appreciated that, as is well known in the semiconductor industry, first conductive layer 12 may be formed by a subtractive method or by a damascene or inlaid method. In a preferred embodiment of the invention, after formation of a final via 18 within a dielectric material sublayer 22, dielectric material sublayer 22 may be subjected to a planarization process to achieve a substantially flat surface of dielectric material sublayer 22. A suitable planarization process may include CMP, ECMP, etching, sputtering, or the like. First conductive layer 12 then may be fabricated by the deposition of a conductive material overlying the substantially flat surface of dielectric material sublayer 22, followed by the patterning and etching of the conductive material to form first conductive layer 12.

After fabrication of first conductive layer 12, a dielectric material 25 may be globally deposited overlying first conductive layer 12 and dielectric material sublayer 22. As described above, when first conductive layer 12 is formed by a subtractive method, dielectric material 25 may be deposited about the side and top surfaces of first conductive layer 12 and overlying dielectric material sublayer(s) 22. In an alternative embodiment of the invention, when first conductive layer 12 is formed by a damascene or inlaid process, dielectric material 25 may be deposited substantially overlying an exposed top surface of first conductive layer 12 and the layer(s) of dielectric material within which first conductive layer 12 is formed.

Figure 3:
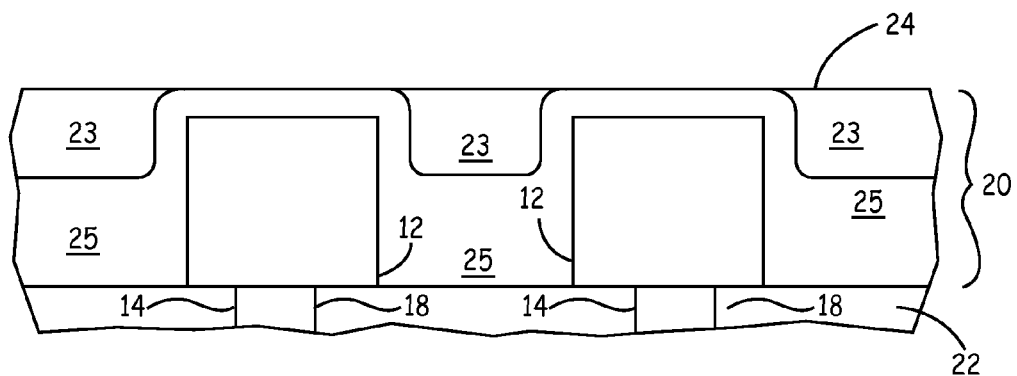

Referring to FIG. 3, a layer of spin-on-glass 23 may be globally deposited overlying dielectric material 25. The spin-on-glass 23 fills any gaps, crevices or other void spaces of dielectric material 25. The layer of spin-on-glass 23 then may be subjected to a removal process to remove excess spin-on-glass 23 and to form a first insulating layer 20 having a substantially planar surface 24. The layer of spin-on-glass 23 may be subjected to any suitable removal process, such as a planarization process or a wet or dry etch. Preferably, the layer of spin-on-glass 23 is etched using a dry etch.

Figure 4:
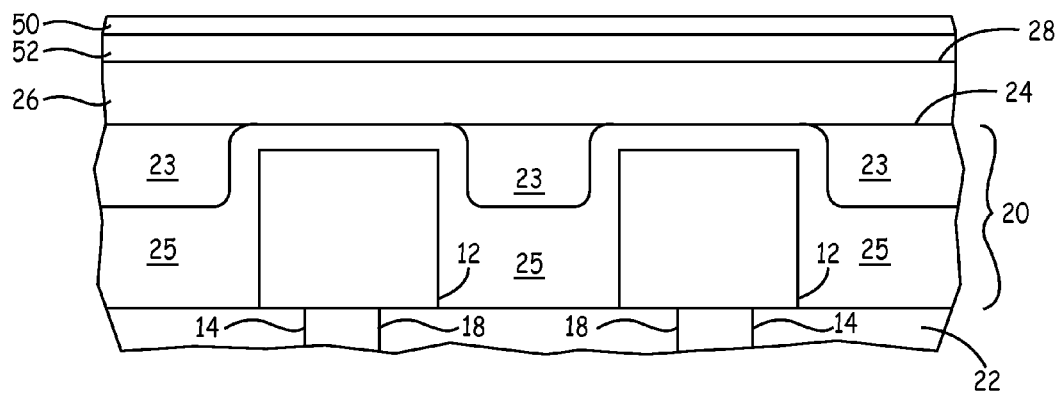

Turning to FIG. 4, in one exemplary embodiment of the invention, a second insulating layer 26 may be deposited overlying first insulating layer 20. As described above, because second insulating layer 26 is deposited overlying the substantially planar surface 24 of first insulating layer 20, second insulating layer 26 also may have a substantially planar surface 28. However, in one embodiment of the present invention, second insulating layer 26 may also be subjected to a planarization process, such as CMP, ECMP, etching, sputtering, or the like, to facilitate formation of substantially planar surface 28.

While FIG. 4 illustrates the formation of semiconductor structure 10 with the deposition of second insulating layer 26, it will be appreciated that, in another exemplary embodiment of the invention, the dielectric material 25 of first insulating layer 20 may be deposited to a thickness such that second insulating layer 26 may be eliminated. In one embodiment of the invention, the thickness of dielectric material 25 of first insulating layer 20 may be in the range of about 10,000 to about 30,000 Angstroms. In a preferred embodiment of the invention, the thickness of dielectric material 25 is in the range of about 13,000 to about 25,000 Angstroms.

Figure 5:
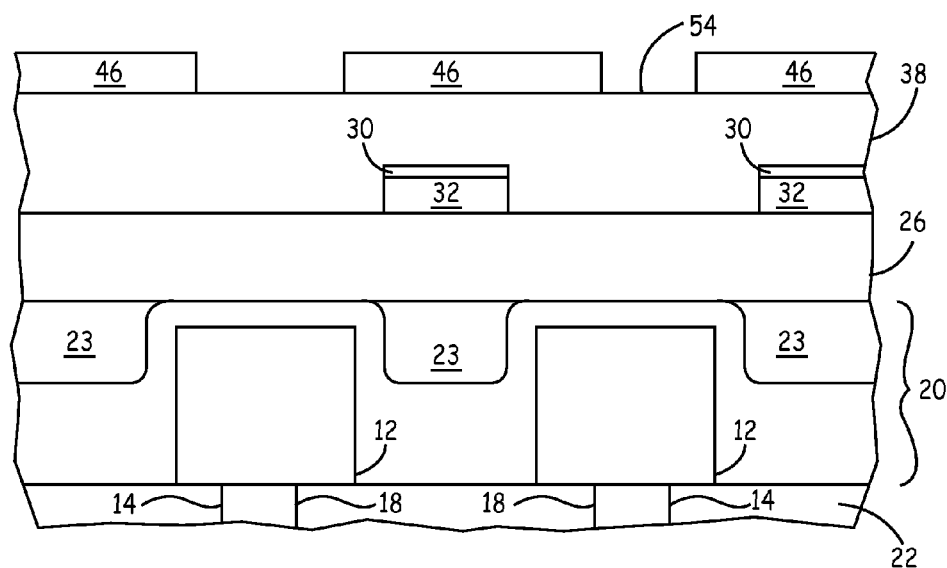

A layer 50 of thin film resistor material then may be globally deposited overlying second insulating layer 26, or first insulating layer 20 if second insulating layer 26 is not present. Layer 50 of thin film resistor material may be deposited using any suitable method, such as, for example, sputtering, which is well known in the semiconductor industry. In one embodiment of the invention, a layer 52 of protective material may be deposited overlying second insulating layer 26 before deposition of thin film resistor material layer 50. As described above, layer 52 of protective material serves to protect the thin film resistor material from diffusion of hydrogen atoms and other species that may degrade the resistance values and, hence, the performance of the thin film resistor material. After deposition, the layer 50 of thin film resistor material, and the layer 52 of protective material if present, are patterned using photolithography and etching, as are well known in the semiconductor art, to form thin film resistor 30 and protective layer 32, as illustrated in FIG. 5. Thin film resistor 30 is fabricated so that it is disposed at least partially offset from first conductive layer 12.

After formation of thin film resistor 30, a third insulating layer 38 may be globally deposited overlying thin film resistor 30 and second insulating layer 26. Third insulating layer 38 may be deposited to a thickness in the range of about 5,000 to about 7,000 angstroms. Third insulating layer 38 then may be subjected to a planarization process, such as by CMP, ECMP, etching, sputtering, or the like, to facilitate formation of a substantially planar surface 54 of third insulating layer 38. In one embodiment of the invention, after planarization, third insulating layer 38 may have a thickness in the range of about 1,000 to about 6,000 Angstroms, and preferably has a thickness of about 3,000 Angstroms. After planarization of third insulating layer 38, a masking layer 46, such as photoresist, may be deposited overlying third insulating layer 38 and patterned.

Figure 6:
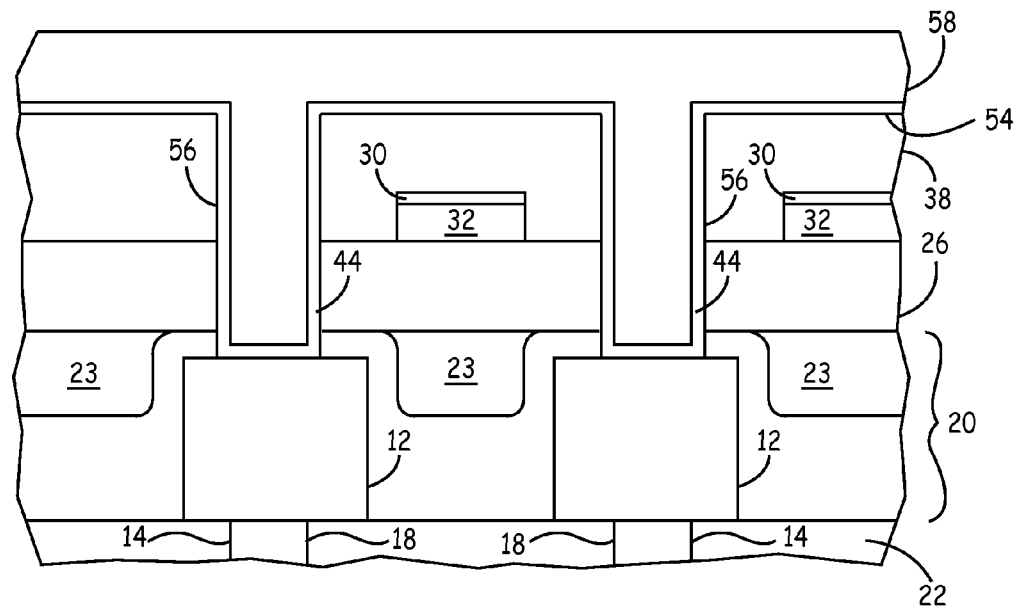

Referring now to FIG. 6, third insulating layer 38 then may be subjected to an anisotropic etch process to form one or more vias 56 that extend to and expose first conductive layer 12. The anisotropic etch of third insulating layer 38 may be performed using any suitable etching process, such as, for example, reactive ion etching. The masking layer 46 then may be removed from third insulating layer 38. It will be appreciated that, because surface 54 of third insulating layer 38 is substantially planar, a higher quality mask transfer is achieved during the anisotropic etching of vias 56 than would be realized if third insulating layer 38 had not been planarized.

A tungsten-comprising conductive fill material 58 then may be globally deposited overlying third insulating layer 38 and within vias 56. Tungsten-comprising conductive fill material 58 may be deposited using any suitable deposition method, such as chemical vapor deposition (CVD), physical vapor deposition or the like. In a preferred embodiment of the invention, tungsten-comprising conductive fill material 58 is deposited by CVD utilizing a suitable tungsten-comprising material precursor, such as, for example, tungsten hexafluoride ($WF_6$). The tungsten-comprising conductive fill material 58 comprises any suitable amount of tungsten such that vias 56 are filled with a step coverage of no less than 50%.

In another exemplary embodiment of the invention, before deposition of tungsten-comprising conductive fill material 58, a barrier layer 44 may be deposited overlying third insulating layer 38 and within vias 56. As described above, barrier layer 44 may serve to improve the adhesion of tungsten-comprising conductive fill material 58 to third insulating layer 38 within vias 56 and also may act as a barrier to diffusion of the tungsten-comprising conductive fill material 58 from vias 56.

Figure 7:
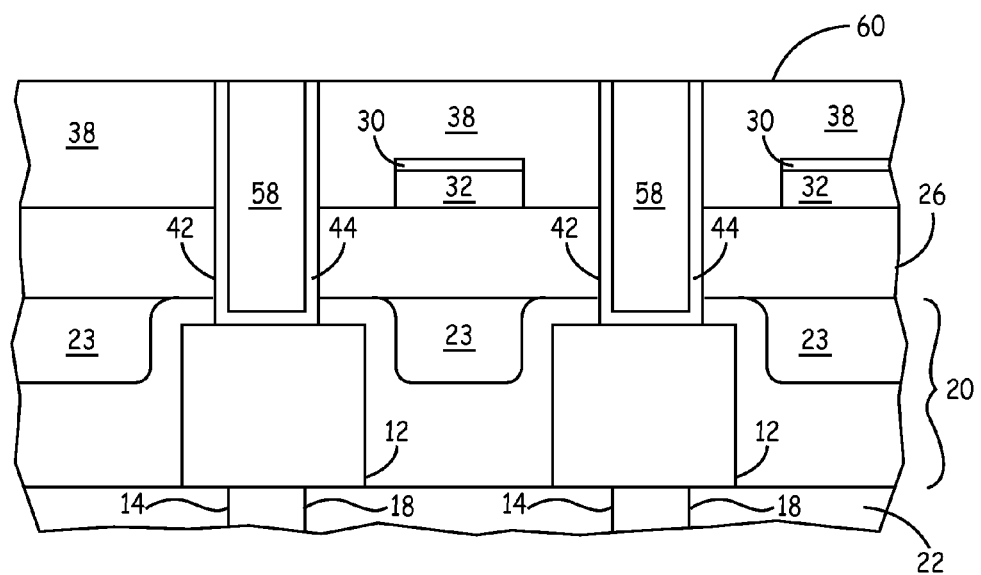

As illustrated in FIG. 7, tungsten-comprising conductive fill material 58, and barrier layer 44 if present, then may be subjected to a planarization process, using CMP, ECMP, etching, sputtering, or the like, to remove excess fill material 58 and barrier layer 44 overlying third insulating layer 38 and to facilitate formation of a substantially planar surface 60 of third insulating layer 38. The planarization of tungsten-comprising conductive fill material 58 and barrier layer 44 results in the formation of a conductive plug 42 disposed within via 56.

Figure 8:
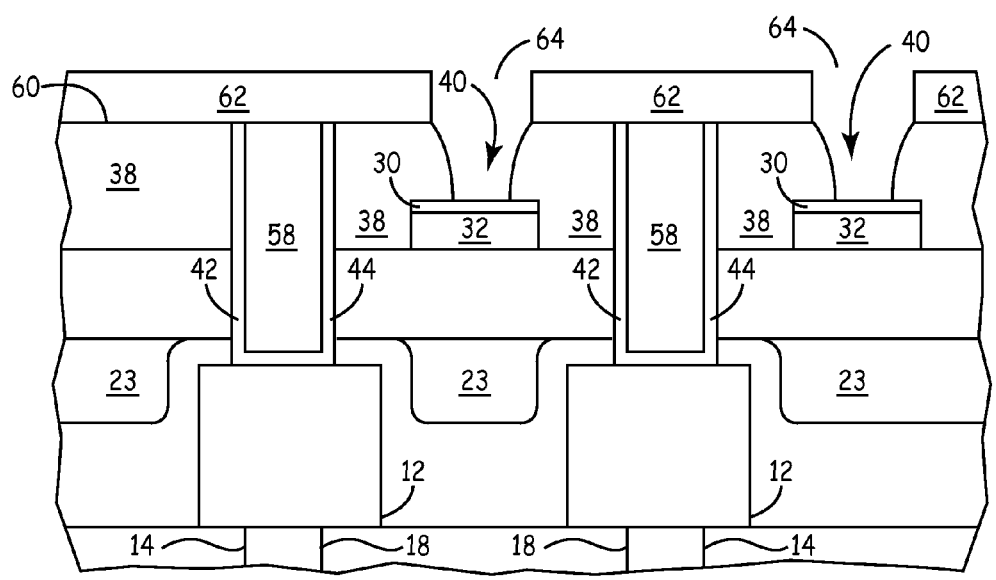

Referring to FIG. 8, a second masking layer 62, such as a photoresist layer, may be deposited overlying third insulating layer 38 and patterned to form openings 64 that expose third insulating layer 38. Third insulating layer 38 then may be subjected to an etching process to form vias 40 that extend to and expose thin film resistor 30. The etch process may utilize any suitable etching method but, preferably, utilizes a wet etch so that a hard mask or other barrier overlying thin film resistor 30 is not required. Masking layer 62 then may be removed from third insulating layer 38. Again, it will be appreciated that, because surface 60 of third insulating layer 38 is substantially planar, a higher quality mask transfer is achieved during the etching of vias 40 than would be realized if third insulating layer 38 had not been planarized.

Referring again to FIG. 1, in one exemplary embodiment of the present invention, semiconductor structure 10 then may be fabricated by globally depositing a second conductive layer 34 overlying third insulating layer 38 and conductive plugs 42 and within vias 40 so that second conductive layer 34 is electrically coupled to thin film resistor 30. Second conductive material layer 34 also is electrically coupled to first conductive layer 12 by conductive plugs 42. In an alternative exemplary embodiment of the present invention, a second conductive material layer may be deposited within vias 40 and overlying third insulating layer 38 and conductive plugs 42. The second conductive layer 34 then may be subjected to a process that removes excess conductive material to expose third insulating layer 38 and conductive plugs 42. After the removal process, a third conductive layer may be deposited overlying third insulating layer 38, conductive plugs 42, and vias 40.

In another exemplary embodiment of the invention, a barrier layer 36 may be deposited overlying third insulating layer 38 and within vias 40 before the deposition of second conductive layer 34. As described above, the barrier layer 36 may serve to improve the adhesion of the second conductive layer 34 to third insulating layer 38 and to act as a barrier against diffusion of the material of second conductive layer 34.

Accordingly, a semiconductor structure and a method of fabricating a semiconductor structure that provides for electrical communication between a thin film resistor and an interconnect stack is provided. The semiconductor structure is suitable for reduction to small geometries and provides thin film resistors with enhanced reliabilities. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor structure, the method comprising:
    forming a first conductive layer of an interconnect stack;
    depositing a dielectric material layer overlying said first conductive layer;
    depositing a layer of spin-on-glass overlying said dielectric material layer;
    removing a portion of said layer of spin-on-glass to form a first insulating layer having a first substantially planar surface;
    forming a thin film resistor overlying said first insulating layer;
    depositing a second insulating layer overlying said first insulating layer and said thin film resistor;
    removing a portion of said second insulating layer to form a second substantially planar surface of said second insulating layer;
    anisotropically etching said second insulating layer to form a first via to said first conductive layer;
    depositing a fill material comprising tungsten within said first via to form a conductive plug that is electrically coupled to said first conductive layer;
    wet etching said second insulating layer to form a second via to said thin film resistor; and
    depositing a second conductive layer overlying said second insulating layer and within said second via so that said second conductive layer is electrically coupled to said thin film resistor;
    wherein said second conductive layer is electrically coupled to said first conductive layer through said conductive plug.

2. The method for fabricating a semiconductor structure of claim 1, wherein depositing a fill material comprising tungsten with said first via comprises:
    depositing said fill material comprising tungsten within said first via and overlying said second substantially planar surface of said second insulating layer; and
    removing a portion of said fill material to form said conductive plug.

3. The method for fabricating a semiconductor structure of claim 1, wherein removing a portion of said layer of spin-on-glass comprises performing a dry etch of said layer of spin-on-glass.

4. The method for fabricating a semiconductor structure of claim 1, further comprising depositing a third insulating layer overlying said first insulating layer prior to forming a thin film resistor and wherein forming a thin film resistor overlying said first insulating layer comprises forming said thin film resistor overlying said third insulating layer.

5. The method for fabricating a semiconductor structure of claim 4, wherein depositing a third insulating layer comprises depositing said third insulating layer to a thickness in the range of about 5,000 to about 25,000 Angstroms.

6. The method for fabricating a semiconductor structure of claim 1, wherein forming a thin film resistor comprises:
    depositing a layer of thin film resistor material to a thickness range of approximately 100 to approximately 500 Angstroms overlying said first insulating layer; and
    etching said layer of thin film resistor material to form said thin film resistor.

7. The method for fabricating a semiconductor structure of claim 1, wherein forming a thin film resistor comprises forming a thin film resistor of chromium silicon (CrSi).

8. The method for fabricating a semiconductor structure of claim 1, wherein removing a portion of said second insulating layer comprises planarizing said second insulating layer using one of chemical mechanical planarization and electrochemical mechanical planarization.

9. The method for fabricating a semiconductor structure of claim 1, wherein anisotropically etching said second insulating layer comprises:
    depositing a layer of photoresist overlying said second insulating layer;
    patterning said layer of photoresist;
    anisotropically etching said second insulating layer; and
    removing said patterned layer of photoresist.

10. The method for fabricating a semiconductor structure of claim 1, wherein depositing a fill material comprises depositing tungsten using chemical vapor deposition.

11. The method for fabricating a semiconductor structure of claim 1, further comprising depositing a barrier layer within said first via prior to depositing said fill material within said first via.

12. The method for fabricating a semiconductor structure of claim 1, wherein depositing a fill material within said first via comprises:
    depositing said fill material within said first via and overlying said second insulating layer; and
    removing a portion of said fill material, and wherein removing a portion of said fill material comprises planarizing said fill material using chemical mechanical planarization or electrochemical mechanical planarization.

13. The method for fabricating a semiconductor structure of claim 1, wherein wet etching said second insulating layer comprises:
    depositing a layer of photoresist overlying said second insulating layer;
    patterning said layer of photoresist;
    etching said second insulating layer using a wet etch; and
    removing said patterned layer of photoresist.

14. The method for fabricating a semiconductor structure of claim 1, wherein depositing a second conductive layer comprises depositing a material comprising one selected from the group consisting of aluminum, aluminum alloys, copper, and copper alloys.

15. The method for fabricating a semiconductor structure of claim 1, further comprising depositing a barrier layer within said second via prior to depositing said second conductive layer within said second via.

16. A semiconductor structure comprising:
  a first conductive layer of an interconnect stack;
  a first insulating layer overlying said first conductive layer, said first insulating layer comprising a dielectric material and spin-on-glass and having a first substantially planar surface;
  a thin film resistor disposed overlying said first insulating layer;
  a second insulating layer overlying said thin film resistor and said first substantially planar surface, said second insulating layer having a second substantially planar surface;
  a second conductive layer overlying said second substantially planar surface;
  a conductive via disposed between said second conductive layer and said thin film resistor, said conductive via electrically coupling said second conductive layer and said thin film resistor; and
  a conductive plug disposed between said second conductive layer and said first conductive layer and electrically coupling said second conductive layer and said first conductive layer, said conductive plug comprising tungsten.

17. The semiconductor structure of claim 16, wherein said dielectric material of said first insulating layer comprises tetraethyl orthosilicate-derived silicon dioxide.

18. The semiconductor structure of claim 16, wherein said thin film resistor comprises CrSi.

19. A method for fabricating a semiconductor structure, the method comprising:

providing an interconnect stack disposed at least partially within at least one dielectric material;

forming a first insulating layer overlying said interconnect stack such that a surface of said first insulating layer is substantially planar;

depositing a second insulating layer overlying said first insulating layer;

forming a thin film resistor overlying said second insulating layer;

depositing a third insulating layer overlying said second insulating layer and said resistor;

removing a portion of said third insulating layer so that a surface of said third insulating layer is substantially planar;

anisotropically etching said third insulating layer to form a first via to said interconnect stack;

depositing a tungsten-comprising fill material within said first via and overlying said substantially planar surface of said third insulating layer;

removing a portion of said fill material to form a conductive plug electrically coupled to said interconnect stack;

wet etching said third insulating layer to form a second via to said thin film resistor; and depositing a conductive layer overlying said third insulating layer, said conductive plug, and within said second via.

20. The method for fabricating a semiconductor structure of claim 19, wherein depositing a first insulating layer comprises:

depositing a dielectric material layer overlying said interconnect stack;

depositing a layer of spin-on-glass overlying said dielectric material layer; and removing a portion of said spin-on-glass.

* * * * *